United States Patent [19]

Roth et al.

[11] Patent Number: 5,480,820
[45] Date of Patent: Jan. 2, 1996

[54] METHOD OF MAKING A VERTICALLY FORMED NEURON TRANSISTOR HAVING A FLOATING GATE AND A CONTROL GATE AND A METHOD OF FORMATION

[75] Inventors: Scott S. Roth; William C. McFadden; Alexander J. Pepe, all of Austin, Tex.

[73] Assignee: Motorola, Inc., Schaumburg, Ill.

[21] Appl. No.: 425,267

[22] Filed: Apr. 17, 1995

Related U.S. Application Data

[63] Continuation of Ser. No. 38,305, Mar. 29, 1993, abandoned.

[51] Int. Cl.[6] .................................. H01L 21/8247
[52] U.S. Cl. .................. 437/43; 437/52; 437/915; 257/316
[58] Field of Search .................. 437/43, 915, 48, 437/52; 257/316; 365/185

[56] References Cited

U.S. PATENT DOCUMENTS

| | | | |
|---|---|---|---|
| 5,045,490 | 9/1991 | Esquivel et al. | 437/43 |
| 5,055,897 | 10/1991 | Canepa et al. | 357/23.5 |
| 5,071,782 | 12/1991 | Mori | 437/48 |
| 5,110,753 | 5/1992 | Gill et al. | 437/43 |
| 5,120,571 | 6/1992 | Gill et al. | 437/43 |
| 5,120,672 | 6/1992 | Mitchell et al. | 437/43 |
| 5,250,450 | 10/1993 | Lee et al. | 437/43 |
| 5,268,320 | 12/1993 | Holler et al. | 437/43 |
| 5,281,548 | 1/1994 | Prall | 437/43 |
| 5,306,935 | 4/1994 | Esquivel et al. | 257/315 |
| 5,354,702 | 10/1994 | Arima et al. | 437/52 |

OTHER PUBLICATIONS

"An Intelligent MOS Transistor Featuring Gate-Level Weighted Sum and Threshold Operations," by Tadashi Shibata and Tadahiro Ohmi, 1991 IEDM, pp. 919–922.

*Primary Examiner*—George Fourson
*Assistant Examiner*—Richard A. Booth
*Attorney, Agent, or Firm*—Keith E. Witek

[57] ABSTRACT

A method for forming a vertical neuron MOSFET begins by providing a substrate (12). One or more conductive layers (24 and 28) are formed overlying the substrate (12). An opening (32) is formed through a portion of the conductive layers (24 and 28) to form one or more control electrodes from the conductive layers (24 and 28). A floating gate (36, and 38) is formed adjacent each of the control electrodes. A dielectric layer (34) is formed within the opening (32) and between the control electrodes and the floating gate (36, and 38) to provide for capacitive coupling between the control electrodes and the floating gate (36, and 38). The capacitive coupling may be altered for each control electrode via isotropic sidewall etching and other methods. By forming the neuron MOSFET in a vertical manner, a surface area of the neuron MOSFET is reduced when compared to known neuron MOSFET structures.

25 Claims, 6 Drawing Sheets

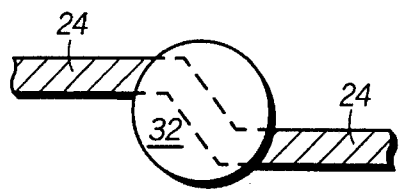
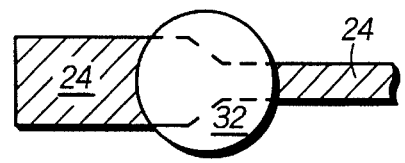
*FIG.16*  *FIG.17*
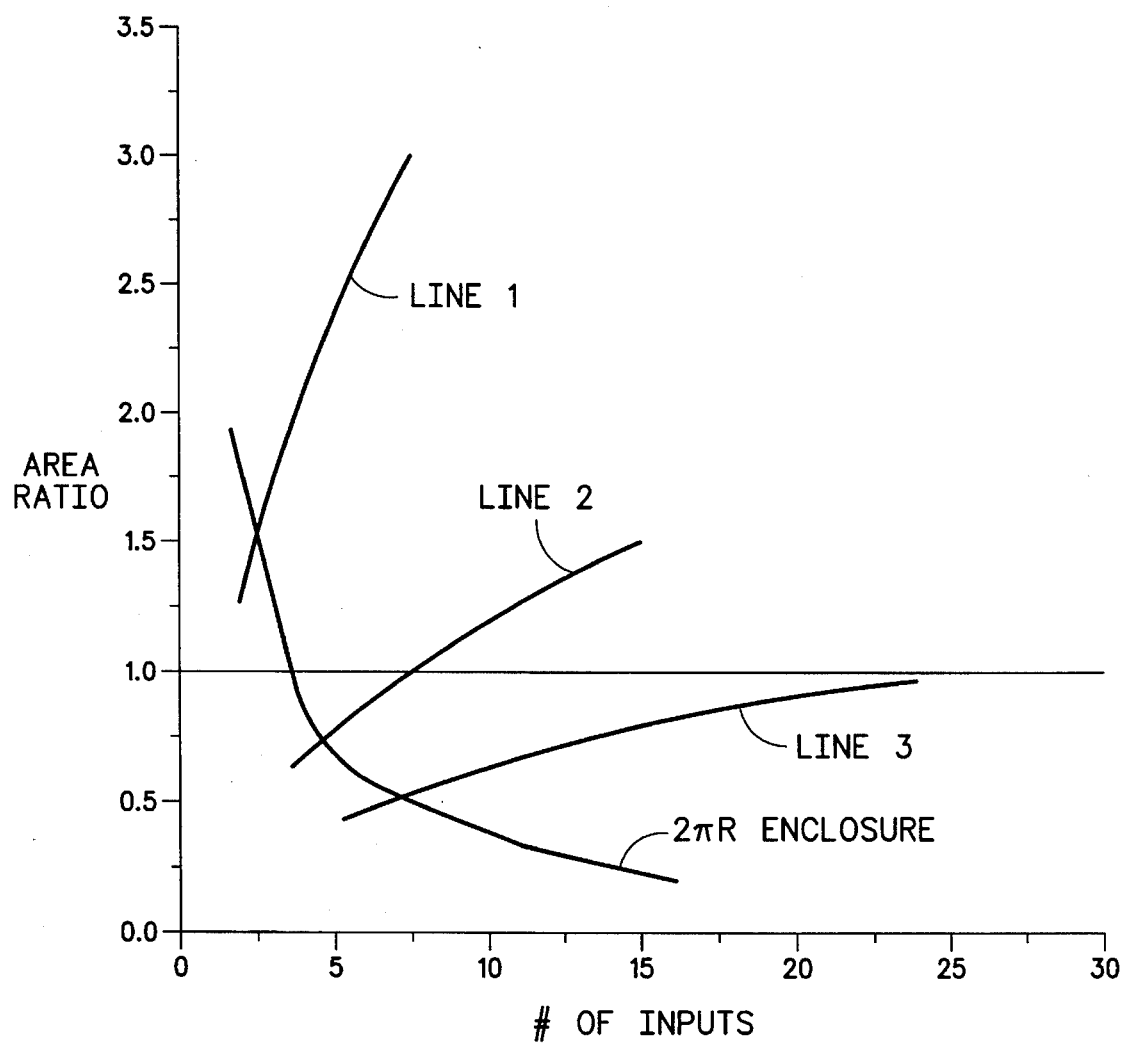
*FIG.18*

METHOD OF MAKING A VERTICALLY FORMED NEURON TRANSISTOR HAVING A FLOATING GATE AND A CONTROL GATE AND A METHOD OF FORMATION

This application is a continuation of prior application Ser. No. 08/038,305, filed on Mar. 29, 1993, entitled "VERTICALLY FORMED NEURON TRANSISTOR HAVING A FLOATING GATE AND A CONTROL GATE AND A METHOD OF FORMATION", (original title) now abandoned.

FIELD OF THE INVENTION

The present invention relates generally to semiconductor technology, and more particularly, to transistors having a floating gate and a control gate.

BACKGROUND OF THE INVENTION

The neuron metal oxide semiconductor field effect transistor (neuron MOSFET) is a device which is relatively new to the integrated circuit community. The neuron MOSFET is formed over a substrate material. A source region, drain region, and a channel region are formed within the substrate material. A floating gate is formed overlying the channel region and separated from the channel region by a gate dielectric. A plurality of control gates is formed overlying the floating gate. Each of the plurality of control gates is formed laterally adjacent each other.

The neuron MOSFET operates differently from both single-control-gate MOSFETs and conventional memory cells. In a neuron MOSFET, no tunneling or hot carrier injection (HCI) is used to generate logic signals. The neuron MOSFET functions by using capacitive coupling. Each of the plurality of control gates is capacitively coupled to the floating gate. The floating gate has the ability to affect the conductivity of the channel region.

Assume, for example, that there are N control gates where N is a positive integer. A control gate is "off" if it is biased to a ground potential, and a control gate is "on" if it is biased at a high potential. The neuron MOSFET is designed so that the transistor is on (i.e. the channel is inverted) if M control gates are "on", where M is less than or equal to N but greater than one. Therefore, the neuron MOSFET operates much like a biological neuron and is more intelligent than a single-control-gate MOSFET.

A disadvantage of the neuron MOSFET is that a large surface area is required to form N control gates laterally adjacent each other. A more compact neuron transistor is required.

SUMMARY OF THE INVENTION

The previously mentioned disadvantages are overcome and other advantages achieved with the present invention. In one form, the present invention comprises a method for forming a transistor device. First, a substrate is provided. After providing the substrate, N control gates are formed overlying the substrate where N is a positive integer greater than zero. After the control gates are formed, a floating gate portion is formed overlying the substrate and adjacent each of the N control gates. The floating gate portion is capacitively coupled to each of the N control gates.

In another form, the invention comprises a transistor. The transistor has a substrate. A source region and a drain region are formed within the substrate. The source region is separated from the drain region by a channel region. A floating gate is formed overlying the channel region. N control gates are formed laterally adjacent the floating gate where N is a positive integer greater than zero. The N control gates are capable of selectively altering the conductivity of the channel region by capacitive coupling through the floating gate.

The present invention will be more clearly understood from the detailed description below in conjunction with the accompanying drawings.

BRIEF DESCRIPTION OF THE DRAWINGS

FIGS. 12–17 each illustrate, in a top perspective view, a control electrode configuration in accordance with the present invention; and FIG. 18 illustrates, in a graph, a surface area comparison of a transistor formed in accordance with the present invention and a conventional planar neuron MOSFET.

DESCRIPTION OF A PREFERRED EMBODIMENT

Figure 1:
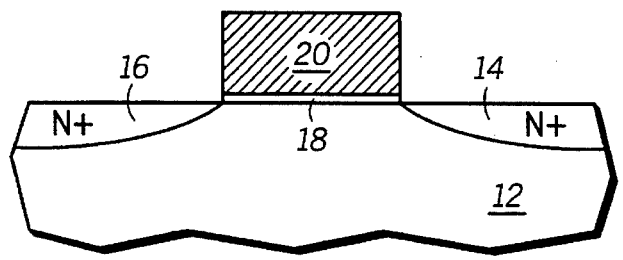
FIGS. 1–6 illustrate, in cross-sectional form, a method for forming a transistor in accordance with the present invention.

Illustrated in FIGS. 1–6 is a method for forming a transistor in accordance with the present invention. FIG. 1 illustrates a substrate 12. In a preferred form the substrate 12 is made of silicon which is usually single-crystalline. Other materials such as gallium arsenide, silicon on insulator (SOI) structures, epitaxial formations, germanium, germanium silicon, polysilicon, amorphous silicon, diamond, and/or like substrate or conductive materials may be used as the substrate 12.

In FIG. 1, a gate dielectric layer 18 is formed. Gate dielectric layer 18 is typically a grown silicon dioxide ($SiO_2$) layer, but may be a composite dielectric or any known gate dielectric layer. In one form, the gate dielectric layer is typically 80–300 angstroms thick. A gate electrode 20 is formed overlying the gate dielectric layer 18. Gate electrode 20 is preferably formed from polysilicon although other conductive materials may be used to form the gate electrode 20. In some cases, gate electrode 20 may be a metal, a silicided layer, a salicided layer, or a like conductive layer. Oxides such as dielectric layer 18 may be etched using, for example, a $CHF_3$ and $O_2$ plasma, a $C_2F_6$ plasma, $NF_3$, or $SF_6$. Polysilicon may be etched using a HBr and $Cl_2$ plasma. Metals are typically etched in a chlorine environment. Any of the above stated plasma environments may contain one or more inert carrier gases such as Ar, $H_2$, He, $N_2$, or a like inert carrier gas. Other etchant gases, fluids, and plasma environments exist in the art. The gate electrode 20 may be insitu doped, diffused, or ion implanted with arsenic, antimony, boron, phosphorus, or the like.

A source region 14 and a drain region 16 are formed within the substrate 12 via an ion implant step which is optionally self-aligned to the gate electrode 20. Lightly doped drain (LDD) regions, spacers, elevated source and drain regions, silicided layers, and like technology may by used for the transistor electrodes of FIG. 1. Usually, the source region 14 and the drain region 16 are symmetrical and therefore interchangeable. Source and drain regions may be referred to as current electrodes.

Figure 2:
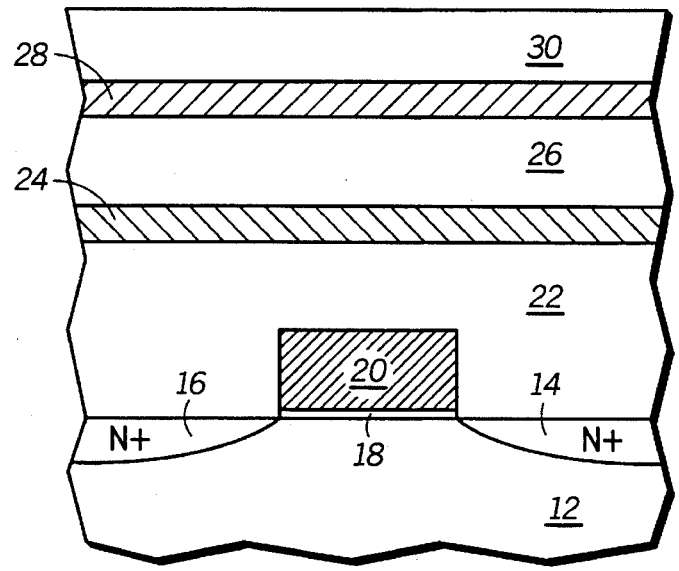

In FIG. 2, a dielectric layer 22 is formed overlying the gate electrode 20. In general, the dielectric layers described herein may be wet or dry silicon dioxide ($SiO_2$), a nitride material, tetraethylorthosilicate (TEOS) based oxides, borophosphosilicate glass (BPSG), phosphate; silicate glass (PSG), borosilicate glass (BSG), oxide-nitride-oxide (ONO), tantalum pentoxide ($Ta_2O_5$), plasma enhanced silicon nitride ($P-SiN_x$), titanium oxide, oxynitride, a composite dielectric layer, and/or like dielectric materials. Specific dielectrics are noted herein when a specific dielectric material is preferred or required. Dielectric layer 22 is preferably a TEOS-based oxide layer. Dielectric layer 22 is optionally planarized via known resist etch back (REB) processing or known chemical mechanical polishing (CMP) techniques.

A conductive layer 24 is formed overlying the dielectric layer 22. Preferably, conductive layer 24 is made of polysilicon although any conductive material may be used. Usually, conductive layer 24 is formed having a thickness within a range of 500–5000 angstroms. The conductive layer 24 is doped via boron, phosphorus, arsenic, and/or a like dopant atom. A dielectric layer 26 is formed overlying the conductive layer 24. Dielectric layer 26 is preferably a TEOS-based oxide layer. A conductive layer 28 is formed overlying the dielectric layer 26. Conductive layer 28 is formed in a manner similar to conductive layer 24. A dielectric layer 30 is formed overlying the conductive layer 28. Dielectric layer 30 is preferably a TEOS-based oxide.

It is important to note that more conductive layers similar to conductive layers 24 and 28 may be formed overlying the dielectric layer 30. In general, M conductive layers, where M is a positive integer greater than zero, may be formed overlying the gate electrode 20. The case of M=2 is illustrated in FIG. 2.

Figure 3:
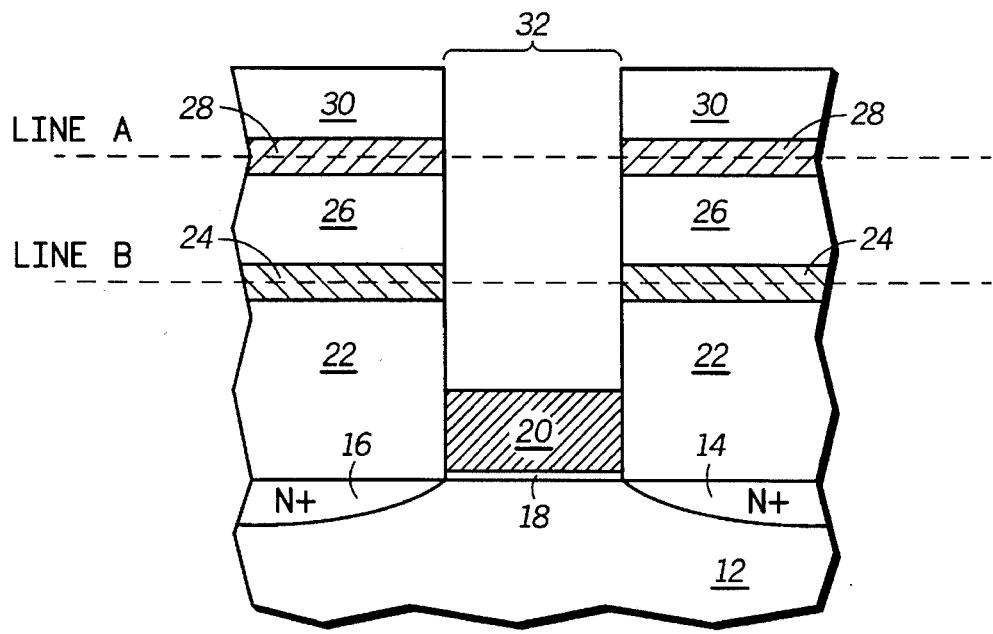

In FIG. 3, an opening 32 is formed through layers 22, 24, 26, 28, and 30. The opening 32 exposes a portion of the gate electrode 20. In one form, the opening 32 will be formed through a middle portion of the conductive layers 24 and 28. Therefore, the conductive layers 24 and 28 have sidewalls which completely surround a perimeter of the opening 32. In another form, the opening 32 may divide one or both of the conductive layers 24 and 28 into N segments, where N is an integer greater than one. The N segments will function as N control electrodes. The formation of N control electrodes will be explained in further detail in a subsequent paragraph.

Figure 4:
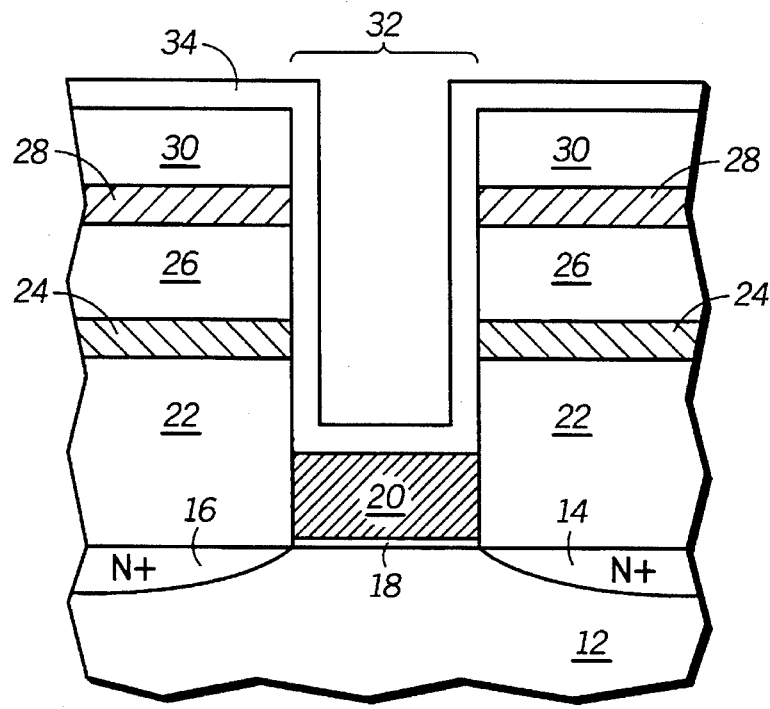

In FIG. 4, a dielectric layer 34 is formed within the opening 32. Dielectric layer is deposited as illustrated in FIG. 4. It should be apparent that a grown oxide on the sidewalls of the conductive layers 24 and 28 will serve the same purpose as a deposited dielectric layer 34. Also, composite grown/deposited dielectric layers may be used in place of dielectric layer 34. Furthermore, a spacer may be used to form a dielectric sidewall layer laterally adjacent the sidewalls of the conductive layers 24 and 28.

Figure 5:
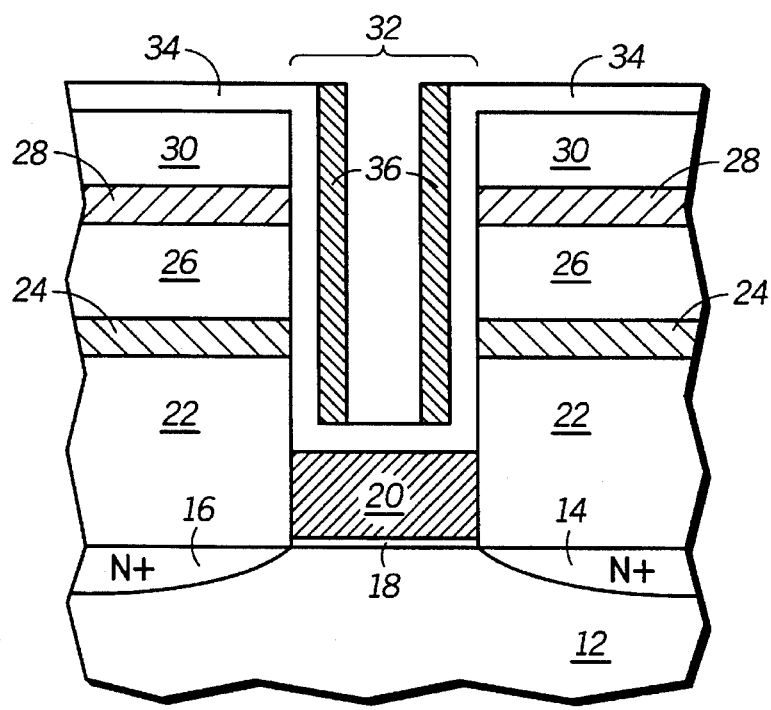

In FIG. 5, a conductive spacer 36 is formed within the opening 32 and is laterally adjacent the dielectric layer 34. The spacer 36 is preferably formed of polysilicon, although a different conductive material, such as metals and silicides, may be used. In general, the dielectric layer 34 functions as an inter-level dielectric or gate dielectric between the conductive layers 24 and 28 and the spacer 36. Spacers are formed by depositing a conformal layer of material (i.e. polysilicon) and etching via a reactive ion etch (RIE) to form sidewall conductive formations.

Figure 6:
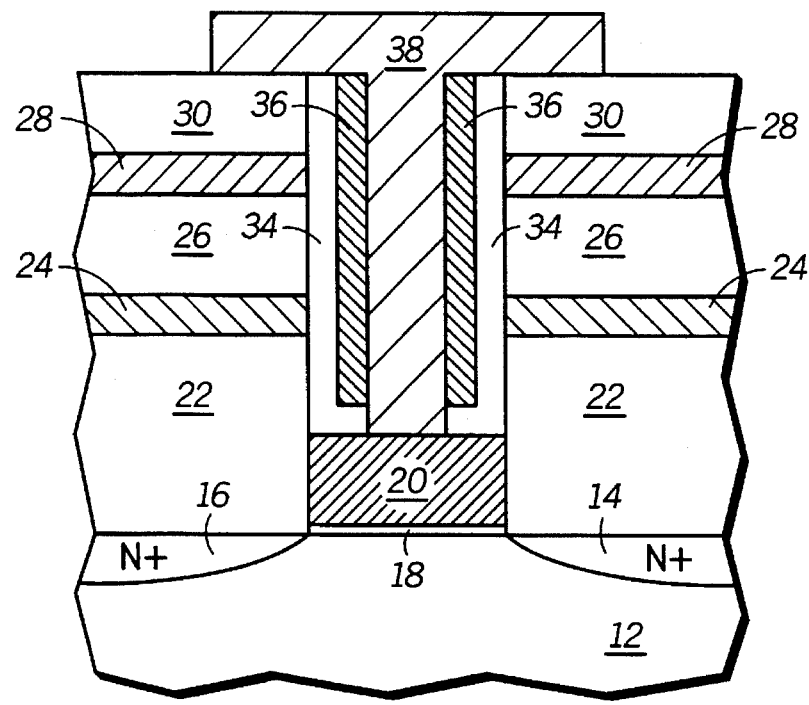

In FIG. 6, the sidewall spacer 36 is used as a mask to etch an opening through the dielectric layer 34 to expose a portion of the gate electrode 20 as illustrated. A conductive layer 38 is formed within the opening 32 and makes electrical contact to the gate electrode 20. FIG. 6 illustrates a neuron MOSFET which has control gates formed by conductive layers 24 and 28. A floating gate is formed by layer 38, spacer 36, and gate electrode 20. It is important to note that the control gates are deposited and patterned before the formation of the floating gate. Typically, to ensure that the channel region conductivity is affected by the floating gate, the floating gate is heavily doped polysilicon or a material which contains a metal.

As discussed earlier, conductive layers 24 and 28 form a plurality of control gates. These control gates are capacitively coupled to the floating gate, and the floating gate selectively alters the conductivity of a channel region, which lies between the source region 14 and the drain region 16. The conductivity change in the channel region is based on the voltages at the control gates. For example, assume that conductive layer 24 forms two control electrodes and that conductive layer 28 forms four control electrodes for a total of six control electrodes. The gate oxide thicknesses of layers 34 and 18, doping levels, and the surface area of the sidewalls of the control electrodes are designed so that each control electrode affects the conductivity of the channel by a predetermined amount.

For example, the oxide thicknesses and surface areas may be designed so that four gates must have a high potential before the channel region inverts and conducts current. Therefore, one, two, or three control gates having a high voltage (the rest of the control gates at a ground potential) will not turn "on" the neuron transistor, but four or more control gates at a high potential (i.e. "on") will turn the device "on". The device in FIG. 6 functions similarly to a biological neuron, and is formed having a vertical structure which conserves area when compared to the conventional neuron MOSFET.

Assume a bulk transistor, as illustrated in FIG. 1, has a channel length=0.50 micron, a channel width=0.50 micron, and a gate oxide thickness=100 angstroms. Zero to five volt logic voltages are used on the control gates. Assume that the control gates and the floating gate are separated by a 100 angstrom thick oxide layer, and that the opening 32 has a 0.25 micron radius. The thickness of the control gate deposited polysilicon film is 1000 angstroms (i.e. conductive layers 24 and 28 are each formed 1000 angstroms thick). Then the capacitance between each control gate and the floating gate is:

$C = \epsilon \cdot \epsilon_o \cdot A/t$ wherein:

C=capacitance $\epsilon$=dielectric constant $\epsilon_o$=permittivity of free space
A=area of control electrode sidewall
t=thickness of dielectric adjacent floating gate $$C=(3.9)(8.85E-14)(2\pi)(0.25)(1000)/(100)$$

$$C=5.42E-16 \text{ farad (for each control electrode)}$$

The voltage on the floating gate as a capacitive function of the voltage on N control gates is:

$$V_f=(C_1V_1+C_2V_2+\ldots+C_NV_N)/Ctot$$

$$Ctot=(C_{trans}+C_1+C_2+\ldots+C_N)$$

wherein:
 $V_f$=the voltage on the floating gate
 C#=the capacitance of a control gate
 V#=the voltage applied to a control gate
 Ctot=the total capacitance between floating gate and control gate(s)
 $C_{trans}$=the capacitance between the transistor channel region and the floating gate $$C_{trans}=(8.85E-14)(3.9)(2.5e-9)/1E-6=8.63E-16 \text{farad}$$

$$Ctot=1.95E-15$$

(assuming two control gates [N=2] wherein each control gate has a sidewall which completely surrounds the opening 32)

$$V_f=[(2)(5.42E-16)(5)]/1.95E-15=2.8 \text{ volts}$$

The equation above indicates that if the two control gates are at a 5 volt potential, the floating gate is at a 2.8 volt potential. One gate at five volts would result in a floating gate voltage of roughly 1.4 volts. If the threshold voltage of the transistor is 2 volts, then one control gate at five volts is not enough to turn on the transistor, two gates at five volts are required to invert the channel (i.e. turn on the transistor device). The threshold voltage may be adjusted by conventional threshold voltage implants, channel doping, substrate doping levels, well doping concentrations, source and drain doping and the like.

The capacitance may be changed between the floating gate and the control gates by altering surface areas, thicknesses of interlevel oxide, changing doping concentrations and the like. For example, the above equations were calculated using a 100 angstrom oxide between the floating gate and the control gates. If this oxide is made to a thickness of 1000 angstroms, then the floating gate voltage ($V_f$) for two gates at a high potential is:

$$V_f=0.28 \text{ volts (for two gates ``on'')}$$

$$V_f=0.14 \text{ volts (for one gate ``on'')}$$

In this case, the control gates affect the floating gate potential in increments of 0.14 volt (there are two control gates assumed for the above equations). Therefore, any voltage range or threshold voltage can be easily integrated into the device of FIG. 6.

Figure 7:
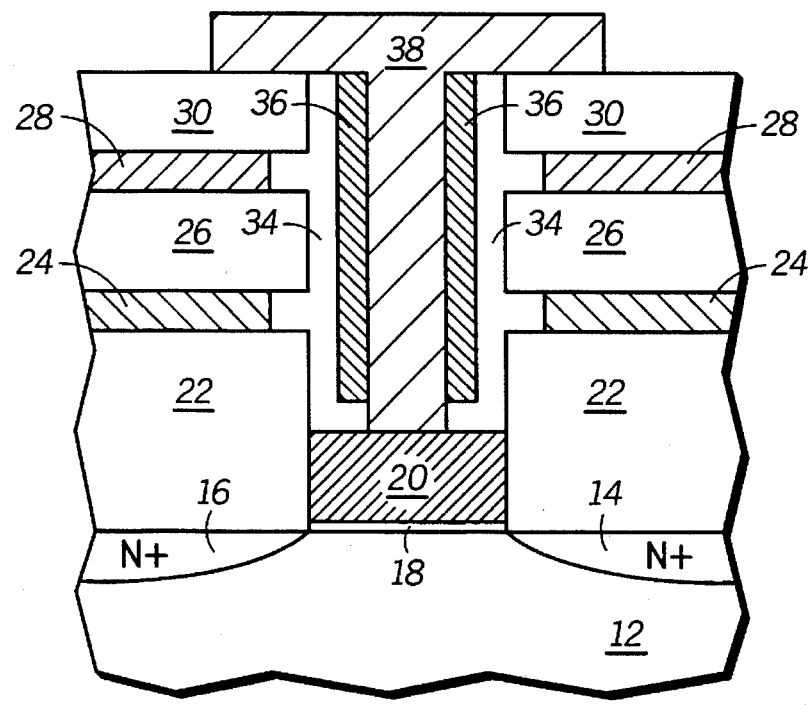
FIG. 7 illustrates, in cross-sectional form, a transistor having laterally recessed sidewalls in accordance with the present invention.

FIG. 7 illustrates a structure which may be used to alter the capacitance of the individual control electrodes. In FIG. 3, the opening 32 is formed. During formation of the opening 32, one or more isotropic etch steps may be used to laterally recess the sidewalls of one or more of the conductive layers 24 or 28. It should be noted that the conductive layer 28 may be recessed while the conductive layer 24 is not recessed due to the sequential etching required to form the opening 32. FIG. 7 illustrates the transistor which results when the sidewalls of both conductive layers 24 and 28 are laterally recessed by an isotropic etch step. Due to the lateral recessing and the dielectric layer 34 essentially conformally filling the recess, the dielectric layer 34 has a different thickness between the control gates and the floating gate than in FIG. 6. This different thickness results in different coupling capacitance.

If the conductive layers 24 and 28 are the same thickness and width (i.e. have the same sidewall surface area), are patterned in a similar manner, and are not independently recessed, then the control gates are said to have the same weight. In other words, each control gate alters the floating gate voltage in a linear and equal fashion. For example, each gate may add 0.5 volts to the floating gate in a cumulative fashion. By selectively altering the thicknesses of the conductive layers 24 and 28, altering the widths of the conductive layers 24 and 28, altering sidewall cross-sectional area, altering the thickness of the dielectric layer 34, sidewall recessing layers as taught herein, and/or the like, the weights of the control gates may be altered. For example, a first control gate may be capable of affecting the floating gate voltage by 0.5 volt, a second control gate may affect the floating gate voltage by 0.8 volt, a third control gate may affect the floating gate voltage by 1.4 volts, and so on. This alteration of weighting is a powerful technique which can be used to customize the operation of the transistor devices illustrated in all of the figures provided herein. In addition, connecting together several conductive layers will allow the capacitive coupling of a control electrode to increase. For example, if the layers 24 and 28 of FIG. 6 are connected together by an interconnect or the like, one control electrode with a larger capacitance (i.e. larger total sidewall surface area) is formed.

Figure 8:
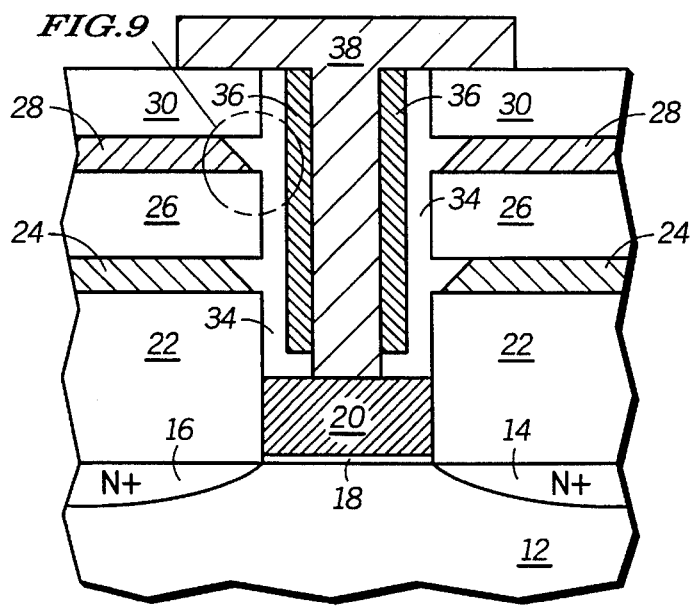
FIG. 8 illustrates, in cross-sectional form, another transistor having laterally recessed sidewalls in accordance with the present invention.

FIG. 8 illustrates another method which may be used to laterally recess the sidewalls of the control electrodes. In FIG. 8 an angled sidewall profile for conductive layers 24 and 28 is illustrated. Angled sidewall profiles are achieved by ion implanting dopant atoms respectively into the conductive layers 24 and 28 to form a doping profile. The doping profile may be different between the conductive layers 24 and 28. A heavy doping profile (i.e. a larger number of doping atoms) will provide a larger angle to the sidewalls illustrated in FIG. 8. Lighter doping will have the opposite effect. A chemical etch process is used during the formation of the opening 32 in FIG. 3 to etch the sidewalls. The sidewalls etch laterally faster along the heavier doped top surfaces of conductive layers 24 and 28 and etch laterally slower along the lighter doped bottom surfaces of conductive layers 24 and 28. In general, the etched sidewall profile mimics the gaussian distribution of the ion implant doping density profile resulting in a non-vertical sidewall.

The increased sidewall surface area may either increase or decrease the capacitance depending upon the thickness of the dielectric layer 34. A thick dielectric layer 34, as illustrated in FIG. 8, would reduce the capacitance.

Figure 9:
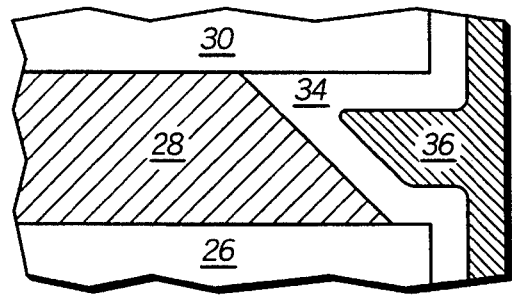
FIG. 9 illustrates, in cross-sectional form, a transistor control gate having increased coupling capacitance in accordance with the present invention.

FIG. 9 illustrates a control sidewall portion of FIG. 8 which results by forming dielectric layer 34 as a thin dielectric layer (a few hundred angstroms in thickness). Dielectric layer 34 forms conformally on the control electrode sidewall surface as illustrated in FIG. 9. Due to the fact that the control electrode sidewall surface is slanted, the effective sidewall surface area of the control electrode is increased. Capacitance between conductive layer 28 and spacer 36 is therefore increased.

Figure 10:
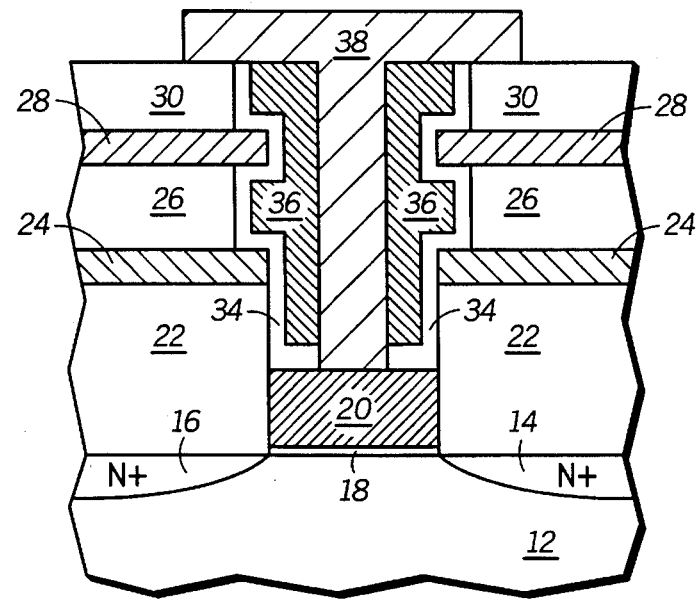
FIG. 10 illustrates, in cross-sectional form, a transistor having control gates with increased coupling capacitance in accordance with the present invention.

FIG. 10 illustrates that the surface area of the control electrode sidewalls may be increased in order to increase capacitance. In FIG. 3, the opening 32 is formed. During or after formation of the opening 32, an isotropic etch is used to laterally recess one or more of the dielectric layers 22, 26, and 30 to expose more surface area of conductive layers 24 and 28. This extra surface area of conductive layers 24 and 28 adds to the capacitive coupling between each control electrode and the floating gate. The isotropic etching illustrated in FIG. 10 may be applied selectively to recess dielectric layers 22, 26, and 30 by different distances in order to alter control electrode weighting.

Figure 11:
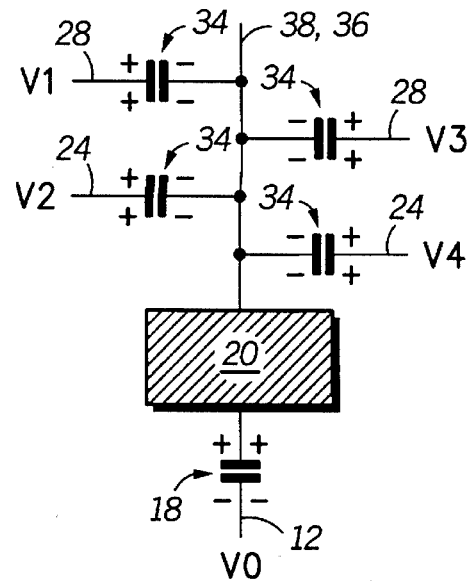
FIG. 11 illustrates, in a partial schematic form, a transistor in accordance with the present invention.

FIG. 11 illustrates in a partial schematic form the capacitances between the control gates and the floating gate. The gate electrode 20 is illustrated as being capacitively coupled through the dielectric layer 18 to the substrate 12 (i.e. the channel region). The floating gate is formed via spacer 36 and conductive layer 38 which are connected to gate electrode 20 as illustrated in FIG. 11. The control gates are illustrated as conductive layers 24 and 28. The dielectric layer 34 forms capacitors between each of the control gates and the floating gate. In FIG. 11, conductive layer 28 was patterned and etched to form two control electrodes, and conductive layer 24 was patterned and etched to form two additional control electrodes for a total of four control electrodes. Voltages applied to the control electrodes alter the voltage of the floating gate in a capacitive coupled manner which then alters the conductivity of the channel region within the substrate 12. Therefore, voltages V1, V2, V3, and V4 in FIG. 11 capacitively affect the channel potential V0.

FIGS. 12–17 illustrate one of either conductive layer 24 or 28 in a top perspective manner after being cross-sectioned along one of either Line A or Line B of FIG. 3. For ease of explanation, conductive layer 24 is illustrated in FIGS. 12–17. In FIGS. 12–17, conductive layer 24 is cross-sectioned along line B. FIGS. 12–17 illustrate that a single conductive layer of material may be used to form one or more control electrodes depending upon conductive layer patterning geometry and the positioning and size of the opening 32.

Figure 12:
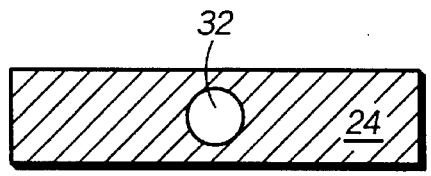

In FIG. 12, if the opening 32 is formed through the center of the conductive layer 24, a single control electrode is formed which has a sidewall capacitive surface that surrounds the entire perimeter of the opening 32. This method of forming control electrodes is known as the "2πr" enclosure method, where "r" is the radius of the opening 32.

Figure 13:
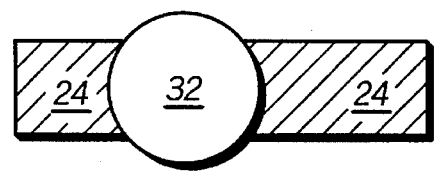

FIG. 13 illustrates that conductive layer 24 may be split into N conductive control electrodes where N=2. The conductive layer 24 is split into two regions by forming the opening 32 larger than a patterned width of the conductive layer 24. In order to avoid electrically short circuiting the two control electrodes to each other, care must be taken to ensure that the positioning of opening 32 is well within photolithographic alignment tolerances. If the conductive layer 24 is formed having a constant width and thickness and the opening 32 is formed symmetrically, then the two control electrodes have the same weight (i.e. the same capacitive affect on the floating gate).

Figure 14:
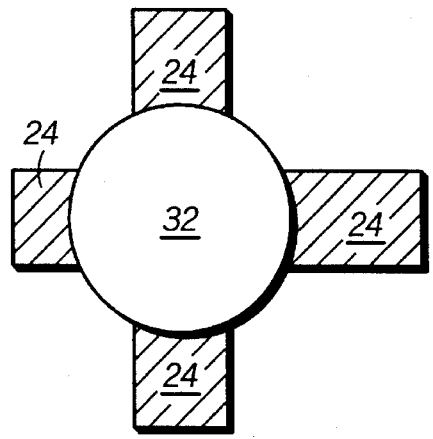

FIG. 14 illustrates that the conductive layer 24 may be segmented into more than two control gates. In general, N control gates may be formed where N is a positive integer greater than zero.

Figure 15:
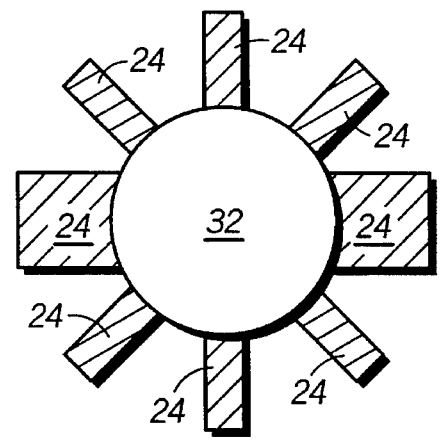

FIG. 15 illustrates that weights may be varied for N conductive control electrodes by varying the lithographically patterned thickness of the conductive layer 24. In addition, the thickness of conductive layer 24 may be altered via a double polysilicon process, an epitaxial growth process, a selective growth process, or a like method. Also, recessing as taught herein and dielectric layer 34 alteration may be used to modify the capacitance of each control electrode.

In the devices illustrated in FIGS. 12–15, any lithographic misalignment of the opening 32 may greatly affect the sidewall surface area of the control electrodes and therefore alter the coupling capacitance. In order to reduce the sensitivity of photolithographic alignment to the surface area of the conductive control electrodes (i.e. the capacitance), a structure illustrated in FIG. 16 may be used. By placing a "kink" into the patterned conductive layer 24 in close proximity to where the opening 32 is to be formed, the dependence of capacitance on lithographic misalignment is reduced.

FIG. 17 illustrates that a patterned reduction in width of conductive layer 24 positioned in close proximity to where the opening 32 is to be formed may be used to alter the capacitance of individual control electrodes.

FIG. 18 is a graph which illustrates the surface area advantages of using a vertical neuron MOSFET, as taught herein, instead of using a planar neuron MOSFET as known in the prior art. The X-axis of FIG. 18 is the number of inputs or the number of control gates within the neuron transistor. The Y-axis of FIG. 18 is the area ratio of vertical neuron MOSFET to the known horizontal neuron MOSFET. Due to the fact that the Y-axis is a surface area ratio, a value of one indicates that the vertical neuron MOSFET and the horizontal MOSFET are formed having the same size. A value less than one indicates that the vertical neuron MOSFET is smaller in terms of surface area than the known horizontal neuron MOSFET. A value larger than one indicates that the horizontal neuron MOSFET is smaller in terms of surface area than the vertical neuron MOSFET taught herein.

It is important to note that FIG. 18 was derived using pessimistic layout design rules for the vertical neuron MOSFET taught herein, and optimal design rules for the known horizontal neuron MOSFET. "Pessimistic design rules" means that the design rules used for the vertical neuron MOSFET were overly limiting in order to compare the conventional horizontal neuron MOSFET to the vertical neuron MOSFET in a worst case scenario. FIG. 18 would be more favorable to the vertical neuron MOSFET taught herein if optimal design rules were also used for the vertical neuron MOSFET.

If one layer of polysilicon is used to form vertical neuron MOSFET control gates, as illustrated by Line 1 of FIG. 18, not much vertical integration is possible. Therefore, the horizontal neuron MOSFET is smaller for most number of inputs. Due to the fact that the horizontal neuron MOSFET requires two levels of polysilicon, Line 1 is purely academic. With two layers of polysilicon used to form control gates, as illustrated in FIGS. 6–8 and 10–11, Line 2 of FIG. 18 illustrates that a small cell is produced. In general, Line 2 indicates that for a neuron MOSFET requiring less than roughly eight control gates, a vertical neuron MOSFET has definite area savings. Line 3 of FIG. 18 indicates that a vertical neuron MOSFET formed via three polysilicon control gate layers is smaller than a horizontal neuron MOSFET up until roughly thirty inputs are required. Therefore, by using a two or three polysilicon control gate process, neuron MOSFETs which function with one to thirty bits are more compactly formed using the vertical neuron MOSFET taught herein.

Furthermore, the neuron MOSFET transistor is typically used for byte-wise logic also referred to as eight-bit logic. Eight-bit logic requires a neuron MOSFET which has eight control gates. In general, M layers of conductive material may be used to form N conductive gates for the vertical neuron MOSFET taught herein. In some cases 16-bit or 32-bit logic may be used. For these applications, the vertical neuron MOSFET having two to four conductive control electrode layers is an optimal surface area device.

FIG. 18 has a line labeled "2πr Enclosure". FIG. 12 illustrates the manner in which a 2πr enclosure control gate is formed. In general, the 2πr enclosure line indicates the surface area which would be achieved if each control electrode is formed from a separate layer of polysilicon. In the prior art, typically one to four layers of polysilicon are used in manufacturing and rarely are more than four layers of polysilicon used. Therefore, a 2πr enclosure device having more than four inputs is purely academic at this point in time.

While the present invention has been illustrated and described with reference to specific embodiments, further modifications and improvements will occur to those skilled in the art. For example, opening 32 may be of any shape and is not required to be circular. Any number of layers of polysilicon or a like conductor may be used to form control electrodes. A single conductive layer may be used to form any number of control electrodes. The capacitance of each control electrode may be optimized and controlled as taught herein. The structure taught herein may be used to form other transistors, many different logic circuits, or several memory devices besides neuron MOSFETs. EEPROMs, EPROMs, flash devices, and other memory or logic circuits may be formed using the structure taught herein. The vertical devices taught herein may be vertically integrated with other vertical devices such as vertical bipolar devices, vertical diodes, vertical MOSFETs, and the like. Control electrodes may be optionally formed overlying the conductive layer 38 of FIG. 6 to form more control electrodes. It is to be understood, therefore, that this invention is not limited to the particular forms illustrated and that it is intended in the appended claims to cover all modifications that do not depart from the spirit and scope of this invention.

We claim:

1. A method for forming a transistor device comprising the sequential steps of:

providing a substrate;

forming N control gates overlying the substrate wherein N is a positive integer greater than one, the N control gates each being used to control the transistor device;

forming a dielectric layer adjacent the N control gates; and forming a floating gate portion overlying the substrate and laterally adjacent each of the N control gates, the floating gate portion being capacitively coupled to each of the N control gates through the dielectric layer to selectively allow charge within the floating gate to be manipulated via voltages placed onto the N control gates, the floating gate portion being formed after the N control gates are formed.

2. The method of claim 1 wherein the step of forming the N control gates comprises:

forming M conductive layers overlying the substrate, where M is a positive integer, the M conductive layers being rank ordered wherein each of the M conductive layers which has a rank greater than one overlies a conductive layer having an immediately lower rank, each of the M conductive layers being patterned to form at least one of said N control gates.

3. The method of claim 1 wherein the step of forming the N control gates comprises:

forming a single contiguous conductive layer overlying the substrate; and forming the single contiguous conductive layer into said N conductive control gates by separating the single contiguous conductive layer into N distinct segments, each N distinct segment being adjacent the floating gate portion.

4. The method of claim 1 further comprising:

defining a channel region adjacent the floating gate, the channel region having a conductivity and each of the N control gates being capacitively coupled to the floating gate portion wherein a voltage applied to one of the N control gates alters the conductivity of the channel region.

5. The method of claim 1 wherein the step of forming the N control gates comprises:

forming a contiguous conductive layer overlying the substrate; and etching an opening through the contiguous conductive layer to physically separate the contiguous conductive layer into said N control gates.

6. The method of claim 5 further comprising:

forming said floating gate portion within said opening.

7. The method of claim 1 wherein the step of forming the N control gates comprises:

forming a vertical sidewall on each of the N control gates, wherein each vertical sidewall is positioned laterally adjacent the floating gate portion.

8. The method of claim 7 wherein the step of forming a dielectric layer comprises:

forming the dielectric layer laterally adjacent each vertical sidewall to separate each of the N control gates from the floating gate portion.

9. The method of claim 1 wherein a dielectric layer is formed overlying one of the N control gates and the step of forming the N control gates comprises:

laterally etching the dielectric layer to increase a surface area which lies between the floating gate portion and the one of the N control gates to increase capacitive coupling surface area between the floating gate and the one of the N control gates.

10. The method of claim 1 wherein the step of forming the floating gate portion comprises:

forming an opening adjacent the N control gates; and forming the floating gate portion within the opening.

11. A method for forming a transistor device comprising the steps of:

providing a substrate; forming a source region and a drain region within the substrate wherein the source region is separated from the drain region by a channel region which has a conductivity;

forming a floating gate overlying the channel region and separated from the channel region by a dielectric;

forming N control gates laterally adjacent the floating gate, where N is a positive integer greater than one, one of the N control gates overlying another of the N control gates, the N control gates selectively altering the conductivity of the channel region by capacitive coupling through the floating gate.

12. The method of claim 11 wherein the step of forming the N control gates comprises:

forming M conductive layers overlying the substrate, where M is a positive integer, the M conductive layers being rank ordered wherein each of the M conductive layers which has a rank greater than one overlies a conductive layer having an immediate lower rank, each of the M conductive layers being patterned to form at least one of said N control gates.

13. The method of claim 11 wherein the step of forming the N control gates comprises:

forming a single contiguous conductive layer overlying the substrate; and segmenting the single contiguous conductive layer into the N conductive gates wherein each of the N conductive gates is adjacent the floating gate.

14. The method of claim 11 wherein the step of forming the N control gates comprises:

forming a contiguous conductive layer overlying the substrate; and etching an opening through the contiguous conductive layer to physically separate the contiguous conductive layer into said N control gates.

15. The method of claim 14 further comprising:

forming said floating gate within said opening.

16. The method of claim 11 wherein the step of forming the N control gates comprises:

forming a vertical sidewall on each of the N control gates, wherein each vertical sidewalls is positioned adjacent the floating gate.

17. A method for forming a transistor device comprising the sequential steps of:

providing a substrate;

depositing a conductive layer of material;

patterning and etching portions of the layer of material to leave behind only remaining portions of the conductive layer;

forming N control gates overlying the substrate wherein N is a positive integer greater than zero, the N control gates being formed from the remaining portions of the conductive layer by etching an opening through the remaining portions of conductive layer forming a dielectric layer adjacent the N control gates; and forming a floating gate portion overlying the substrate, within the opening, and adjacent each of the N control gates, the floating gate portion being capacitively coupled to each of the N control gates through the dielectric layer.

18. A method for forming a transistor device comprising the steps of:

providing a substrate;

forming a source region and a drain region within the substrate wherein the source region is separated from the drain region by a channel region which has a conductivity;

forming N control gates by forming a contiguous conductive layer overlying the substrate, patterning the contiguous conductive layer into an interconnect line and etching an opening through the interconnect line to physically separate the interconnect line into at least one of the N control gates, N being a positive integer greater than zero; and forming a floating gate overlying the channel region and within the opening such that only a sidewall portion of the N control gates are laterally adjacent a sidewall of the floating gate, the N control gates selectively altering the conductivity of the channel region via capacitive coupling through the floating gate.

19. A method for forming a transistor device comprising the steps of:

providing a substrate;

forming a source and drain region within the substrate and separated by a channel region;

forming a control electrode conductive layer overlying the substrate;

patterning the control electrode conductive layer to form at least one control electrode;

patterning the at least one control electrode to form an opening area for a floating gate layer;

forming a inter-level dielectric adjacent the at least one control electrode to isolate the control electrode;

forming the floating gate layer in the opening area and after the step of forming a control electrode, the floating gate layer being adjacent the channel region and capacitively coupled to the at least one control gate.

20. A method for forming a transistor device comprising the steps of:

providing a substrate;

forming a source region and a drain region within the substrate, the source and drain regions being separated by a channel region also lying within the substrate;

forming a control electrode conductive layer overlying the substrate;

etching an opening through the control electrode conductive layer to form at least one control electrode having a sidewall;

forming a inter-level dielectric on the sidewall of the at least one control electrode to isolate the sidewall of the at least one control electrode;

forming a floating gate layer after the step of forming a control electrode, the floating gate layer overlying the channel region and being capacitively coupled to the sidewall of the at least one control gate through the inter-level dielectric formed on the control gate sidewall, the floating gate being formed by depositing, in separate steps, two layers of conductive material which share an electrically-coupled common boundary wherein the two layers of conductive material consist of the same material.

21. A method for forming a transistor device comprising the steps of:

providing a substrate;

forming a gate dielectric layer overlying the substrate;

forming a first floating gate portion overlying the gate dielectric layer;

forming a source and drain within the substrate and in close proximity to the first floating gate portion;

forming at least one control gate overlying the substrate, the step of forming at least one control gate resulting in an opening which exposes a top portion of the first floating gate portion;

forming a dielectric layer which isolates the at least one control gate;

forming a second floating gate portion within the opening; and forming a third floating gate portion within the opening which connects to both the first floating gate portion and the second floating gate portion to form one floating gate from the first, second, and third floating gate portions.

22. A method for forming a transistor device comprising the steps of:

provide a substrate;

forming a source region and a drain region within the substrate, the source and drain regions being separated by a channel region;

forming a floating gate overlying the channel region by depositing at least two conductive layers wherein the at least two conductive layers are electrically coupled to each other; and forming a first and a second electrically-separated control gates adjacent the floating gate where the first electrically-separated control gate overlies the second electrically-separated control gate and both the first and second electrically-separated control gates alter a quantity of charge within the floating gate.

23. The method of claim 22 wherein the step of forming the floating gate comprises:

depositing two different layers of conductive material at two separate times where the two different layers of conductive material share a common electrically-connected boundary and form the floating gate.

24. The method of claim 22 wherein the step of forming the floating gate comprises:

depositing three different layers of conductive material at three separate times where the three different layers of conductive material are electrically coupled to collectively form the floating gate.

25. A method for forming a transistor device comprising the sequential steps of:

providing a substrate;

forming N control gates overlying the substrate wherein N is a positive integer greater than one, the N control gates each being used to control the transistor device;

forming a dielectric layer adjacent the N control gates; and forming a floating gate portion overlying the substrate and adjacent each of the N control gates, the floating gate portion being capacitively coupled to each of the N control gates through the dielectric layer, a portion of the floating gate being a conductive sidewall spacer.

* * * * *